(12) United States Patent
Miyajima

(10) Patent No.: US 7,046,335 B2
(45) Date of Patent: May 16, 2006

(54) EXPOSURE APPARATUS AND DEVICE FABRICATION METHOD

(75) Inventor: Yoshikazu Miyajima, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 88 days.

(21) Appl. No.: 10/826,071

(22) Filed: Apr. 15, 2004

(65) Prior Publication Data

US 2004/0207826 A1 Oct. 21, 2004

(30) Foreign Application Priority Data

Apr. 15, 2003 (JP) .............................. 2003-110211

(51) Int. Cl.
G03B 27/42 (2006.01)
G03B 27/68 (2006.01)
G02B 7/02 (2006.01)
G02B 7/182 (2006.01)

(52) U.S. Cl. ........................ 355/53; 355/52; 359/822; 359/846

(58) Field of Classification Search .................. 355/30, 355/52, 53, 67, 71, 77; 359/290, 291, 292, 359/295, 819, 846, 847, 849, 822
See application file for complete search history.

(56) References Cited

U.S. PATENT DOCUMENTS

| 5,212,582 | A  | * | 5/1993  | Nelson ......................... 359/224 |
| 6,295,118 | B1 | * | 9/2001  | Takeuchi ....................... 355/52 |
| 6,526,118 | B1 | * | 2/2003  | Komatsuda et al. ........... 378/34 |
| 6,549,271 | B1 | * | 4/2003  | Yasuda et al. ................. 355/55 |
| 6,747,783 | B1 | * | 6/2004  | Sandstrom ................... 359/290 |
| 6,781,671 | B1 | * | 8/2004  | Komatsuda ................... 355/67 |
| 6,909,493 | B1 | * | 6/2005  | Sudoh .......................... 355/75 |
| 2004/0257683 | A1 | * | 12/2004 | Petasch et al. .............. 359/847 |

* cited by examiner

*Primary Examiner*—Alan Mathews
(74) *Attorney, Agent, or Firm*—Morgan & Finnegan, L.L.P.

(57) ABSTRACT

An exposure apparatus illuminates a pattern on an original form, introduces light from the pattern to a plate, and exposes the plate. The exposure apparatus includes at least one optical element, and forcing member that applies a force to the at least one optical element in a non-contact manner.

6 Claims, 13 Drawing Sheets

EXPOSURE APPARATUS AND DEVICE FABRICATION METHOD

This application claims a benefit of a foreign priority based on Japanese Patent Application No. 2003-110211, filed on Apr. 15, 2003, which is hereby incorporated by reference herein in its entirety as if fully set forth herein.

BACKGROUND OF THE INVENTION

The present invention relates to an exposure apparatus used for a semiconductor manufacturing process, and a projection exposure apparatus that projects and transfers a reticle pattern onto a silicon wafer. The present invention is suitable for an extreme ultraviolet ("EUV") exposure apparatus that uses EUV light with a wavelength of about 13 to 14 nm as exposure light and a mirror optical system for projection exposure in vacuum.

A prior art example will be described with reference to FIGS. 10 and 11. 101 uses a YAG solid laser etc. serving as an excitation laser for exciting gasified, liquefied or atomized-gasified light-source material atoms into plasma for light emissions by irradiating a laser beam onto the light-source material.

102 is a light-source emitting part that maintains an internal structure to be vacuum. 102A is a light source A of an actual emitting point in an exposure light source.

103 is a vacuum chamber that contains an exposure apparatus, and can maintain the vacuum state using a vacuum pump 104.

105 is an exposure light introducing part (or an illumination optical system) for introducing exposure light from the light-source emitting part 102, which includes mirrors A (or 105A) to D (or 105D), to make uniform and shape the exposure ray.

106 is a reticle stage, and its movable part is mounted with a reflective original form 106A that produces a pattern to be exposed.

107 is a reduction projection mirror optical system that reduces and projects an exposure pattern reflected from the original sequentially form through mirrors A (or 107A) to E (or 107E) at a predefined reduction ratio.

108 is a position-controlled wafer stage for positioning a wafer 108A, as a Si substrate, into a predetermined exposure position so that the wafer stage can be moved along six axes directions, i.e., moved in the XYZ directions, tilted about the XY axes, and rotated around the Z axis. The pattern on the original form 106A is to be reflected, reduced and projected onto the wafer 108A.

109 is a reticle stage support for supporting the reticle stage 105 on an apparatus installation floor. 110 is a projection optical system body for supporting the reduction projection mirror optical system 107 on the apparatus installation floor. 111 is a wafer stage support for supporting the wafer stage 108 on the apparatus installation floor.

The reticle stage, the reduction projection mirror optical system, and the wafer stage, are supported by the reticle stage support, the projection optical system body and the wafer stage support, respectively. These include means (not shown) for measuring relative positions so as to continuously maintain their predetermined configuration.

A mount (not shown) for violation isolation from the apparatus installation floor is provided on the reticle stage support 109, the projection system body 110, and the wafer stage 111, which are provided independently.

112 is a reticle stocker that includes a storage container that temporarily stores, in an airtight condition, plural original forms 106A as the reticles supplied from the outside to the inside of the apparatus and suitable for different exposure conditions and patterns.

113 is a reticle changer for selecting and feeding a reticle out of the reticle stocker 112.

114 is a reticle alignment unit that includes a rotary hand that can travel along the XYZ axis directions and can rotate about the Z axis. The reticle alignment unit 114 receives the original form 106A from the reticle changer 113, rotates it by 180°, and feeds it to a reticle alignment scope 115. The reticle alignment scope 115 is provided at the end of the reticle stage 106 for fine movements of the original form 106A rotating about the XYZ-axes and aligns the original form 106A with an alignment mark 115A provided on the reduction projection mirror optical system 107. The aligned original form 106A is chucked on the reticle stage 106.

116 is a wafer stocker that includes a storage container for temporarily storing plural wafers 108A from the outside to the inside of the apparatus.

117 is a wafer feed robot for selecting a wafer 108A to be exposed, from the wafer stocker 116, and feeds it to a wafer mechanical pre-alignment temperature controller 118 that roughly adjusts feeding of the wafer in the rotational direction and controls the wafer temperature within controlled temperature in the exposure apparatus.

119 is a wafer feed hand that feeds the wafer that has been aligned and temperature-controlled by the wafer mechanical pre-alignment temperature controller 118 to the wafer stage 108.

120 and 121 are gate valves used as mechanisms for opening and closing a gate for supplying the reticle and wafer from the outside of the apparatus. 122 is also a gate valve that uses a diaphragm to separates spaces among the wafer stocker 116, the wafer mechanical pre-alignment temperature controller 118, and the exposure in the apparatus. The gate valve 122 opens and closes only when moving the wafer 108A in and out of the apparatus.

Such a separation using the diaphragm can minimize a capacity to be temporarily released to the air when the wafer 108A is fed in from the outside of and fed out of the apparatus, and quickly form a vacuum equilibrium state.

Thus, when the conventionally structured exposure apparatus positions the mirrors A to E relative to the mirror barrel 107F as shown in FIG. 11, the mirror deforms by its own weight (in a direction depicted by the arrow in the drawing). Mirrors used for an exposure apparatus that uses the EUV light are required to maintain such strict surface shape precision as 1 nm or smaller, but this precision cannot be guaranteed when the mirror deforms due to its own weight.

When the mirror's surface shape precision deteriorates in the projection optical system, it deteriorates imaging performance, increases aberration, and lowers light intensity.

When the mirror's surface shape precision deteriorates in the illumination optical system, it produces lowered and non-uniform light intensity on the mask. In particular, when a light-source mirror deforms due to its own weight, the light intensity deteriorates, which causes insufficient condensing.

BRIEF SUMMARY OF THE INVENTION

Accordingly, it is an object of the present invention to provide an (illumination and/or projection) optical system that can precisely adjust a mirror's surface shape, and an exposure apparatus that has such an optical system.

An exposure apparatus of one aspect according to the present invention includes an illumination optical system for illuminating a pattern on an original form, a projection optical system that introduces light from the pattern to a plate to expose the plate, at least one optical element, and at least one forcing member that applies a force to the at least one optical element in a non-contact manner.

DETAILED DESCRIPTION OF THE PREFERRED EMBODIMENTS

Figure 1:
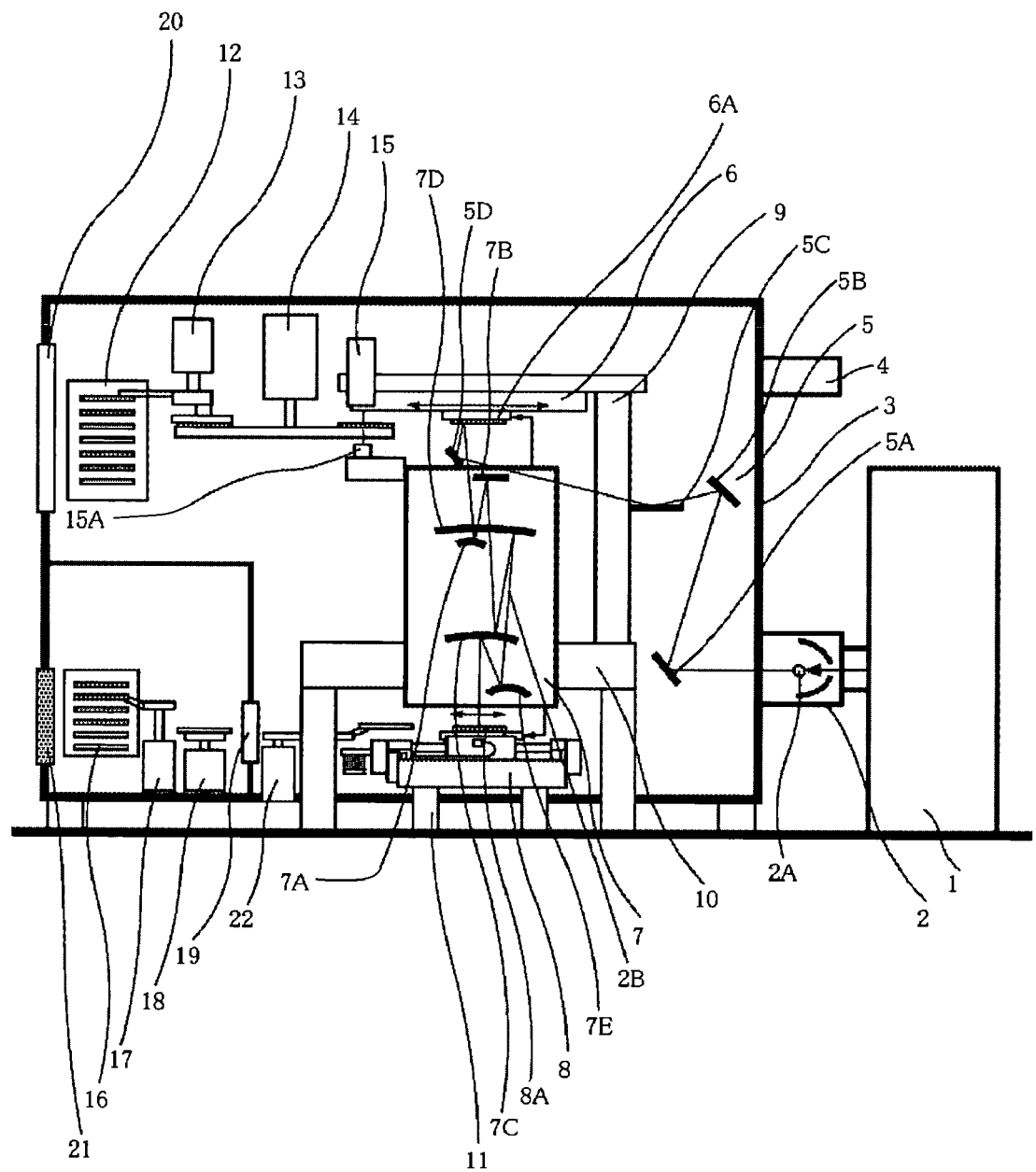
FIG. 1 is an overview of an exposure apparatus of an embodiment.

A description will be given of embodiments according to the present invention with reference to FIGS. 1 to 9.

First Embodiment 1 uses a YAG solid laser etc., serving as an excitation laser for exciting gasified, liquefied or atomized-gasified light-source material atoms into plasma for light emissions by irradiating a laser beam onto the light-source material.

2 is a light-source emitting part that maintains an internal vacuum. 2A is a light source A of an actual emitting point of an exposure light source.

3 is a vacuum chamber that contains an exposure apparatus, and can maintain the vacuum state using a vacuum pump 4.

5 is an exposure light introducing part for introducing exposure light from the light-source emitting part 2, serving as an illumination optical system for illuminating the original form 6A using illumination light from the light-source emitting part 2. The exposure light introducing part includes mirrors A (or 5A) to D (or 5D), and shapes the exposure light for uniform illumination of the original form 6A. The number of mirrors in the exposure light introducing part (as an illumination optical system) is not limited to four, and may be four to eight. Mirrors more than eight would decrease the light intensity of the illumination light for illuminating the original form.

6 is a reticle stage, and its movable part of its reticle stage is mounted with a reflective original form 6A that forms a pattern to be exposed.

7 is a reduction projection mirror optical system that reduces and projects an exposure pattern reflected from the original form 6A. The reduction projection mirror optical system includes mirrors A (or 7A) to E (or E), and reflects the light from the pattern through these mirrors A to E to reduce and project the pattern formed on the original form onto the wafer at a predefined reduction ratio. 7F is a mirror barrel that holds the mirrors A to E. The number of mirrors in the exposure light introducing part is not limited to five, and may be four to eight or another number.

8 is a position-controlled wafer stage for positioning a wafer 8A, as a Si substrate, into a predetermined exposure position so that the wafer stage can be moved in six-axes directions, i.e., moved in the XYZ directions, tilted around the XY axes, and rotated around the Z axis. The pattern on the original form 6A is to be reflected, reduced and projected onto the wafer 8A.

9 is a reticle stage support for supporting the reticle stage 5 on an apparatus installation floor. 10 is a projection optical system body for supporting the reduction projection mirror optical system 7 on the apparatus installation floor. 11 is a wafer stage support for supporting the wafer stage 8 on the apparatus installation floor.

The reticle stage, the reduction projection mirror optical system, and the wafer stage, which are distinctly and independently supported by the reticle stage support, the projection optical system body and the wafer stage support, respectively. They include means (not shown) for measuring relative positions to continuously maintain their predetermined configuration. A mount (not shown) for violation isolation from the apparatus installation floor is provided on the reticle stage support, the projection system body, and the wafer stage.

12 is a reticle stocker that includes a storage container that temporarily stores, in an airtight condition, plural original forms as reticles supplied from the outside to the inside of the apparatus and suitable for different exposure conditions (such as an illumination condition) and patterns (such as a pattern width and an aspect ratio).

13 is a reticle changer for selecting and feeding a reticle from the reticle stocker 12.

14 is a reticle alignment unit that includes a rotatable hand that can travel along the XYZ directions and can rotate about the Z axis. The reticle alignment unit 14 receives the original form 6A from the reticle changer 13, rotates it by 180°, and feeds it to the reticle alignment scope 15 provided at the end of the reticle stage 6 for fine movements of the original form 6A rotating about the XYZ-axes and aligns the original form 6A with the alignment mark 15A provided on the reduction projection mirror optical system 7. The aligned original form is chucked on the reticle stage 6.

16 is a wafer stocker that includes a storage container for temporarily storing plural wafers 108A from the outside to the inside of the apparatus.

17 is a wafer feed robot for selecting a wafer to be exposed, out of the wafer stocker 16, and feeds it to a wafer mechanical pre-alignment temperature controller 18.

The wafer mechanical pre-alignment temperature controller 18 roughly adjusts feeding of the wafer in the rotational direction, and controls the wafer temperature within controlled temperature in the exposure apparatus.

19 is a wafer feed hand that feeds to the wafer stage 8 the wafer that has been aligned and temperature-controlled by the wafer mechanical pre-alignment temperature controller 18.

20 and 21 are gate valves as a mechanism for opening and closing a gate for supplying the reticle and wafer from the outside of the apparatus.

22 is also a gate valve that uses a diaphragm to separates spaces among the wafer stocker 16, the wafer mechanical pre-alignment temperature controller 18, and the exposure in the apparatus. The gate valve 22 opens and closes only when feeding the wafer 8A in and out of the apparatus.

Such a separation using the diaphragm can minimize a capacity to be temporarily released to the air when the wafer 8A is fed in from the outside of and fed out of the apparatus, and form a vacuum equilibrium state.

Figure 2:
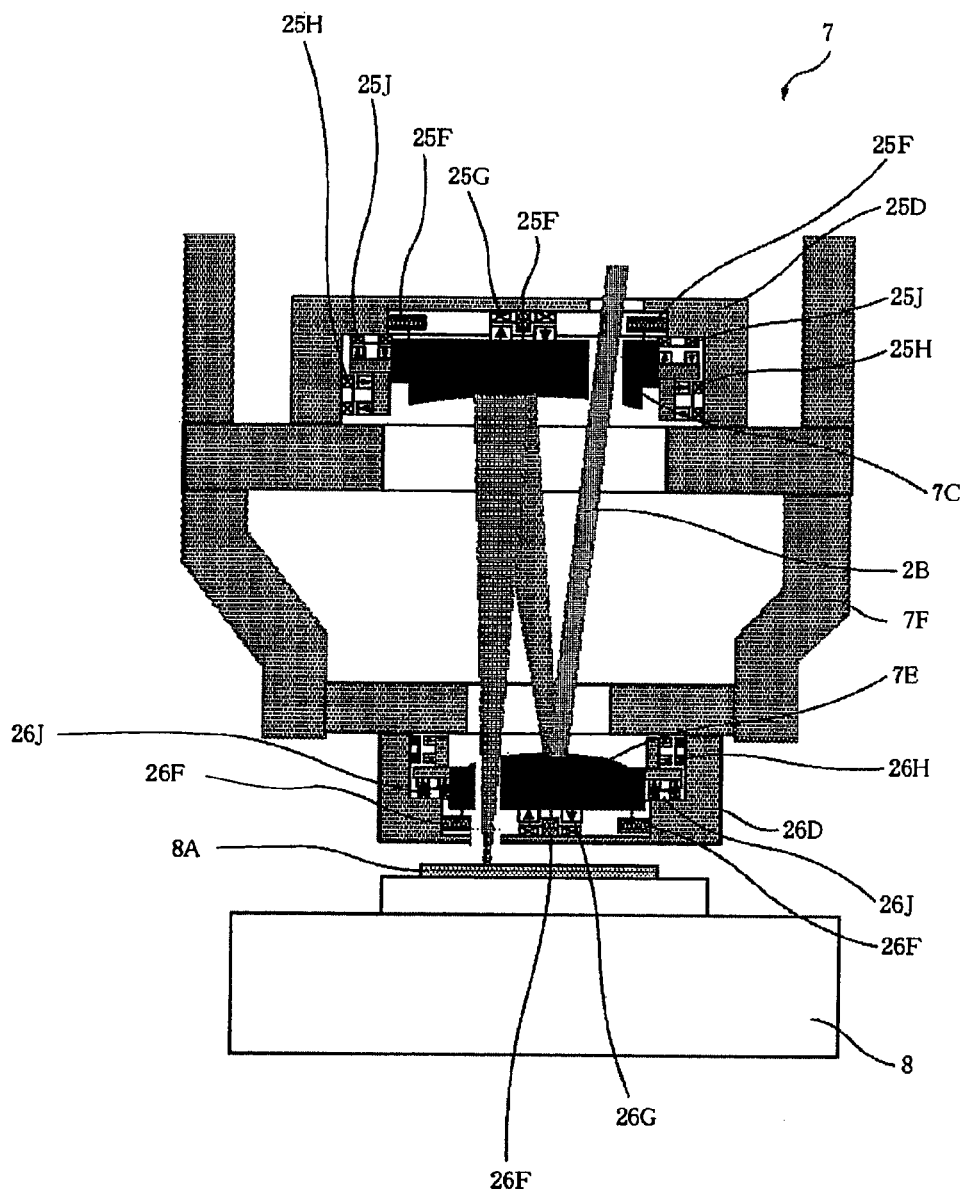
FIG. 2 is a detailed view of mirrors in a projection optical system of the embodiment.

FIG. 2 is a schematic view of a first embodiment, exemplifying mirrors C (or 7C) and E (or 7E) in the reduction projection mirror optical system 7.

The mirror 7C includes a mirror holding element 25D coupled to the mirror barrel, a mirror displacement measuring means 25F provided on the mirror holding element 25D, gravity compensation force generating means 25G and Z-thrust generating means 25J for compensating gravity deformations in a mirror's vertical direction and positions due to the gravity deformations, and horizontal position compensation thrust generating means 25H for compensating horizontal positions (in the XY directions) of the mirror 7C. Members 25G, 25J and 25H include a Lorentz force generating means that includes a drive coil and a magnet.

The force applied to the mirror by the gravity compensation force generating means is, but not limited to, one that reduces the amount of deformation due to gravity. Depending upon the measurement result of the wave front aberration of the entire optical system that includes the mirror, the force can be one that increases the mirror's gravity deformation. In other words, it is preferable that the gravity compensation force generating means forces the mirror to deform based on the measurement result of the wave front aberration so that the aberrational amount is smaller than a predetermined permissible value.

The mirror 7E includes the mirror holding element 26D coupled to the mirror barrel, mirror displacement measuring means 26F provided on the mirror holding element 26D, gravity compensation force generating means 26G and Z-thrust generating means 26J for compensating gravity deformations in the mirror's vertical direction and positions due to the gravity deformation, and horizontal position compensation thrust generating means 26H for compensating horizontal positions (in the XY directions) of the mirror 7E. Elements 26G, 26J and 26H include a Lorentz force generating means that includes a drive coil and a magnet.

A description will now be given of the measurement method of an aberrational target value through total reflection mirrors in the projection optical system.

Figure 3:
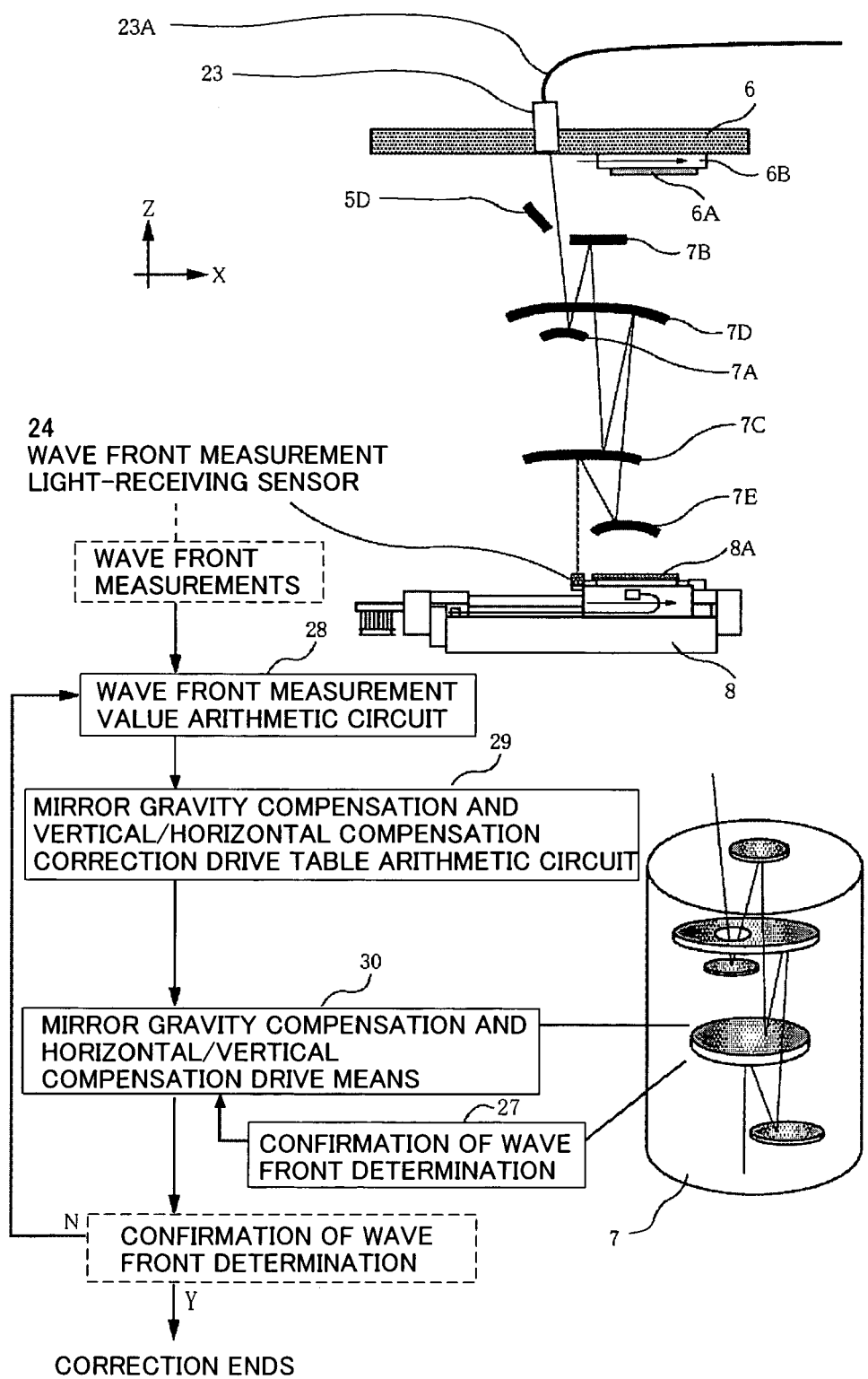
FIG. 3 is a structural view of a mirror wave front measurement unit for mirrors of the embodiment.

While the reticle chuck slider 6B of the reticle stage 6 (i.e., reticle stage slider) retracts, as shown in FIG. 3, the measurement light supplied from a wave front measurement light source supply optical fiber 23A (i.e., wave front measurement light supply fiber) is emitted from a wave front measurement light source emission opening 23. The measurement light is reflected on all the reflective surfaces on the mirrors in the projection optical system, and a wave front measurement light-receiving sensor 24 installed on the wafer stage 8's movable part receives the light. The wave front aberration of the projection optical system (for all the mirrors) is measured based on the detection result by the wave front measurement light-receiving sensor.

Next, a wave front measurement value arithmetic circuit 28 calculates the wave front aberration amount based on the wave front measurement value measured by the wave front measurement light-receiving sensor 24. A mirror gravity compensation and vertical/horizontal compensation correction drive table arithmetic circuit 29 calculates corrective drive directions and drive amounts (or applied power directions and applied power amounts) of the mirrors A (or 7A) to E (or 7E) based on the wave front aberration value, and transmits them as target values to the mirror gravity compensation and horizontal/vertical compensation drive means 30 that includes 25G, 25J, 25H, 26G, 26J, 26H, etc. Although it is preferable that each of the mirrors A to E includes position measuring, position compensating and forcing means, only some of the mirrors may include them.

Simultaneously, the mirror system displacement measurement arithmetic circuit 27 collects signals that reflect position information of the mirrors A (or 7A) to E (or 7E) from the mirror displacement measurement means, such as 25F and 26F, and measures the mirror positions from the mirror barrel and the relative positions of the mirrors.

After the mirror gravity compensation and horizontal/vertical compensation drive means 30 that includes 25G, 25J, 25H, 26G, 26J, 26H, etc. drives each mirror to the target position and relative positions between the mirrors and the mirror barrel are measured, the wave front is measured again. When the wave front aberration is equal to the specification or is below the predetermined amount, the corrections end. However, when the wave front aberration differs from the specification or is greater than the predetermined amount, the wave front measurement arithmetic circuit recalculates the residual wave front aberration amount to repeat the above correction and reduce the wave front aberration down to the target specification.

The target wave front aberration amount is one generated in the apparatus when the projection optical system solely adjusts a mirror position initially, and reduces the aberration below the appropriate target amount. A position and shape of each mirror at this time are origins of the mirror position and mirror shape. Of course, the target wave front aberration amount may use another value, and the origins for the mirror position and mirror shape may not be those which are obtained at the initial adjustment time. The target value is set only for the wave front aberration amount without introducing a concept of the origins for the mirror position and mirror shape.

With respect to the origin of the mirror position, it is possible to reduce the aberration down to the target position by driving the mirror gravity compensation and horizontal/vertical compensation drive means 30 (or mirror drive means).

Second Embodiment

Figure 4:
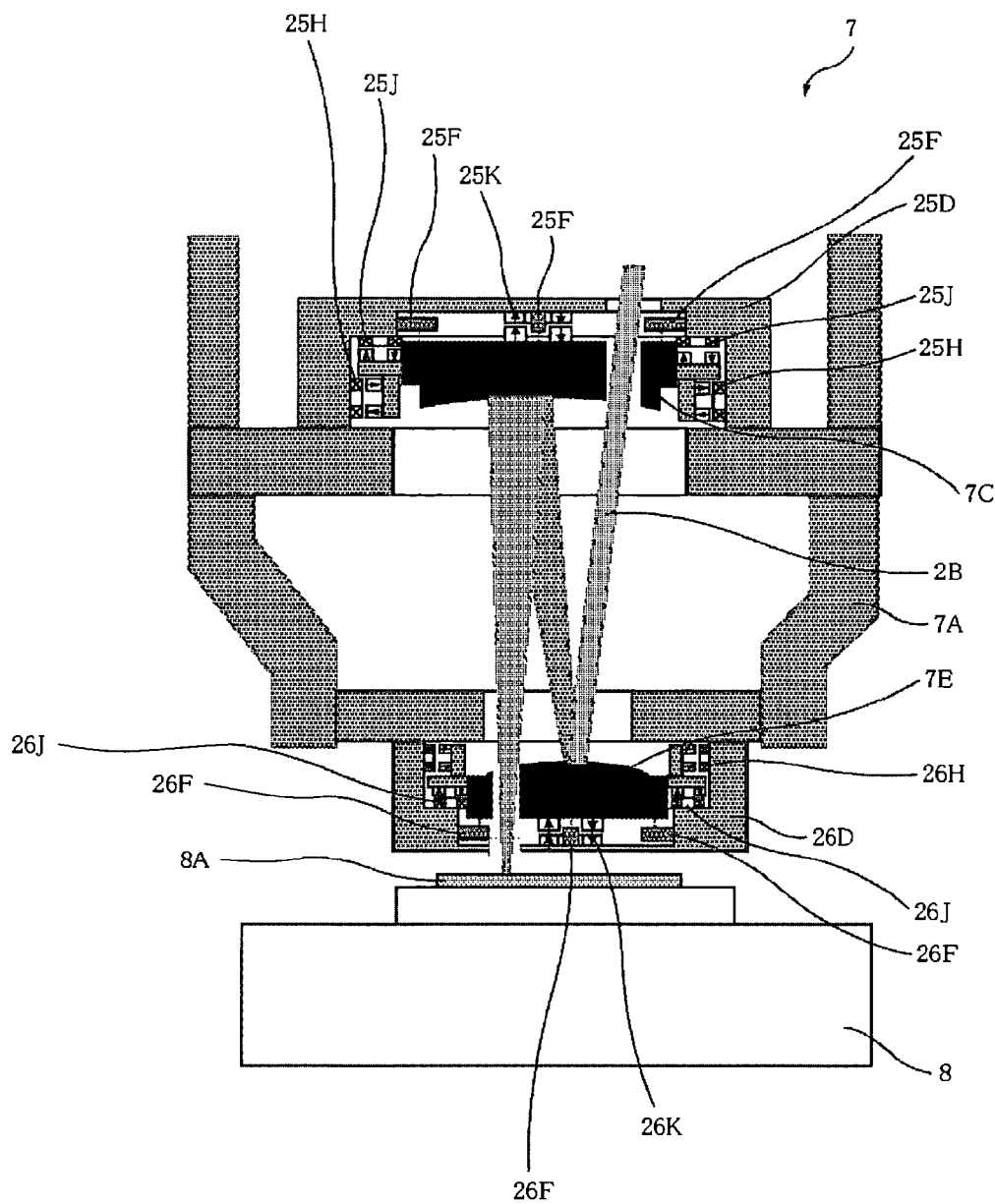
FIG. 4 is a detailed view of mirrors in a projection optical system of another first embodiment.

A description will be given of the second embodiment with reference to FIG. 4.

While the first embodiment uses the Lorentz force for the gravity compensation force generating means, a method that uses a permanent magnet to apply a suction force is also applicable in addition to the Lorentz force. The second embodiment is different from the first embodiment in using the permanent magnet.

The gravity compensation force generating means 25K and 26K have a magnet and use this magnet to generate a force onto a mirror in a direction opposing the gravity force along an approximately central axis of the mirror. The cancellation between the magnet's magnetic force and the mirror's gravity can compensate (and reduce) the mirror's deformation due to its own weight.

In the gravity compensation that uses the permanent magnet as in the second embodiment, the magnet suction force is controlled by a gap adjustment unit (not shown) between the magnets (i.e., between the magnet attached to the mirror and the magnet attached to the mirror barrel or the magnet attached to the mirror holding element coupled to the mirror barrel).

Third Embodiment

Figure 5:
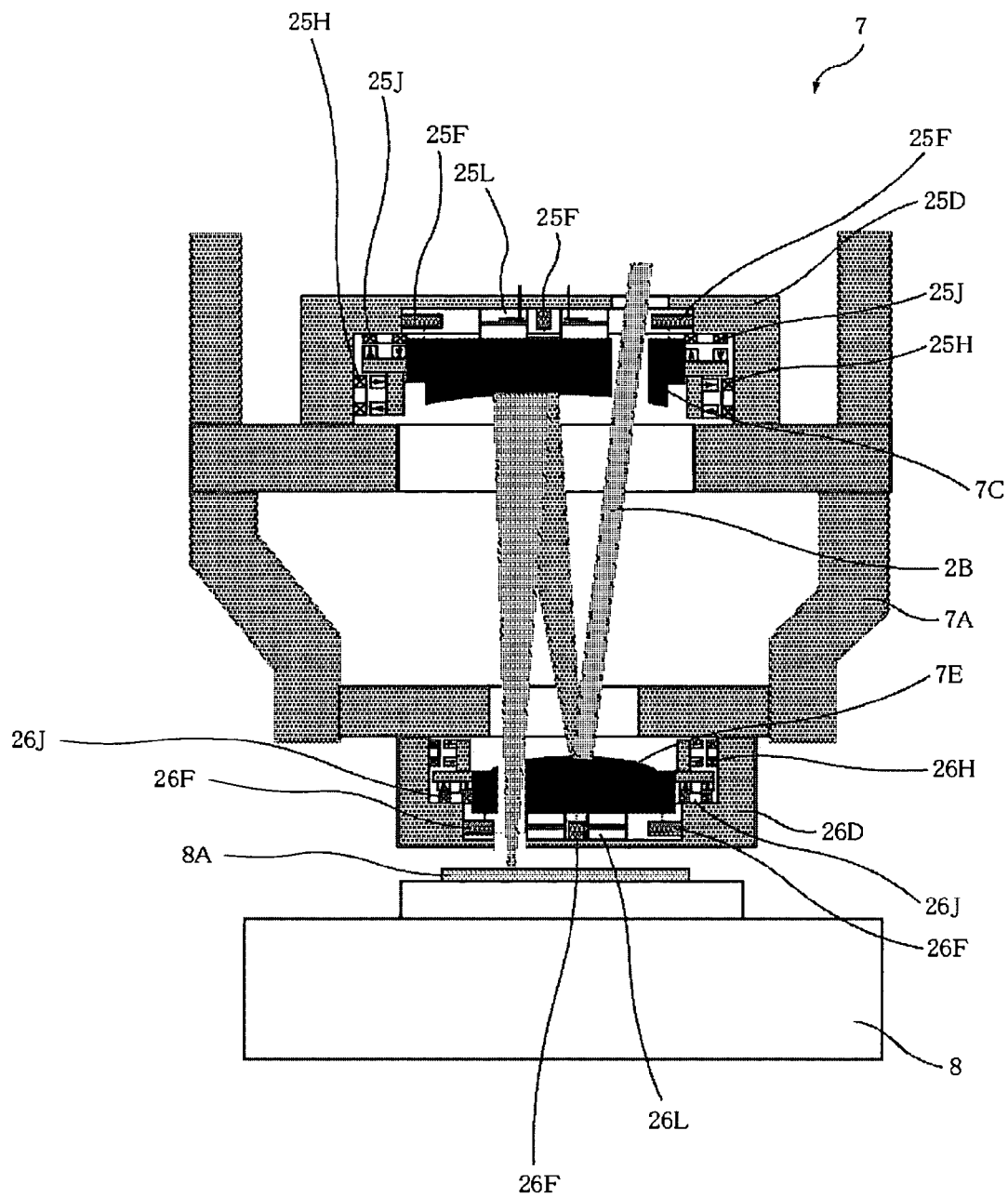
FIG. 5 is a detailed view of mirrors in a projection optical system of another second embodiment.

A description will be given of the third embodiment with reference to FIG. 5.

The gravity compensation force generating means can use a method that employs a permanent magnet to apply a suction force instead of the Lorentz force. The third embodiment enables the gravity compensation force generating means 25L and 26L to use the electrostatic suction force to compensate (and reduce) the mirror's deformation due to its own weight.

This embodiment generates an electrostatic suction force in a direction opposing the gravity force along the approximately central axis of the mirror. The cancellation between the electrostatic suction force and the mirror's gravity can reduce the mirror's deformation amount due to its own weight.

In compensating the mirror's deformation due to its own weight using the electrostatic suction force as shown in the third embodiment, the applied potential should be controlled, for example, by an electrostatic chuck.

Fourth Embodiment

Figure 6:
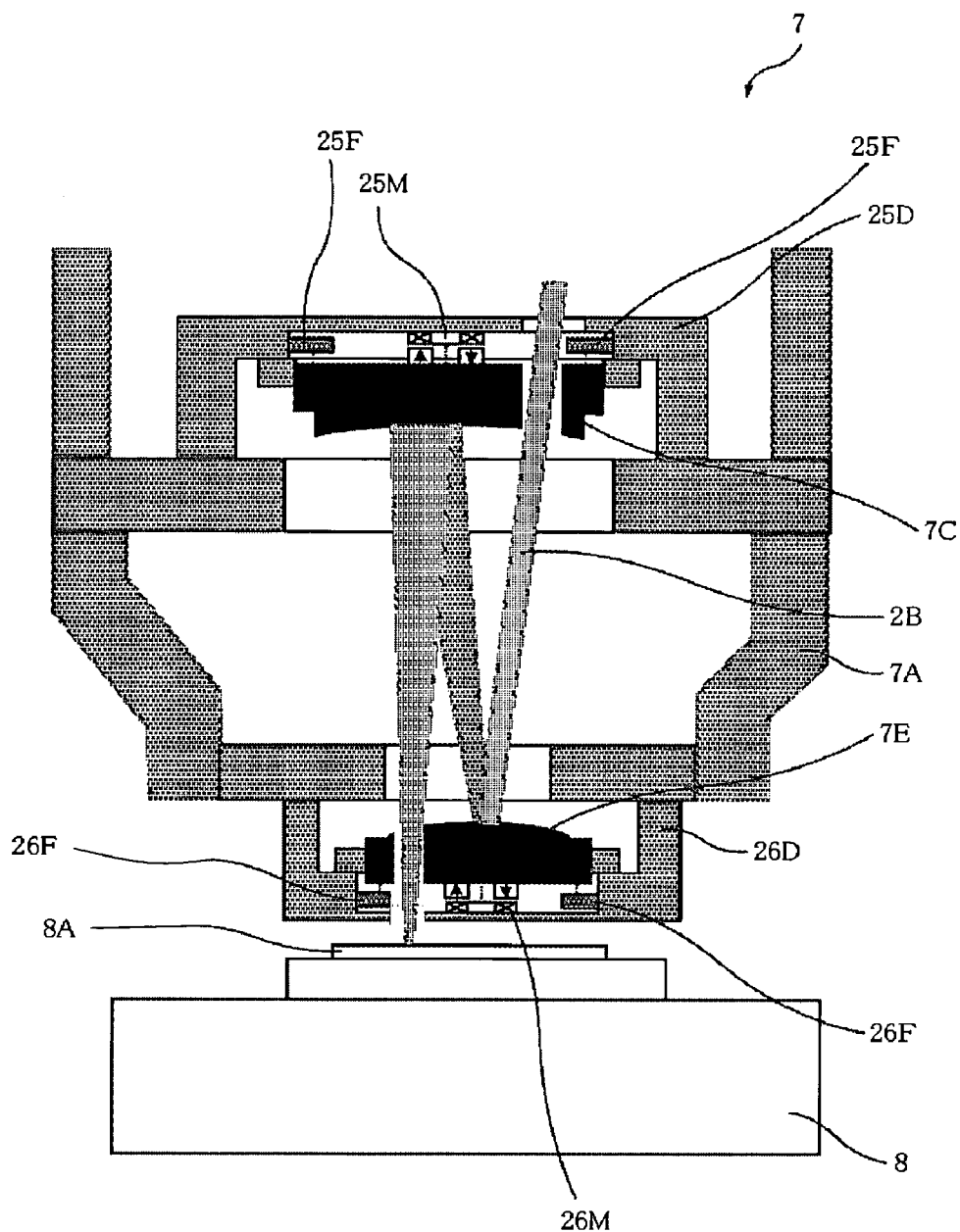
FIG. 6 is a detailed view of mirrors in a projection optical system of another third embodiment.

A description will be given of the fourth embodiment with reference to FIG. 6.

The first embodiment uses both the gravity compensation force generating means and the XYZ position compensating means to hold and control positions of the mirrors in a non-contact manner. On the other hand, the fourth embodiment (shown in FIG. 6) compensates for only the gravity without the XYZ positioning control. This embodiment configures the mirror displacement measurement means 25F and the gravity compensation force generating means 25M as in the first embodiment, and fixes the mirror C (or 7C) onto the mirror holding element 25D without the position displacement means etc.

Similarly, the mirror displacement measuring means 26F and gravity compensation force generating means 26M have structures similar to those in the first embodiment, and the mirror E (or 7E) is fixed onto the mirror holding element 26D without the position displacement means etc.

Figure 7:
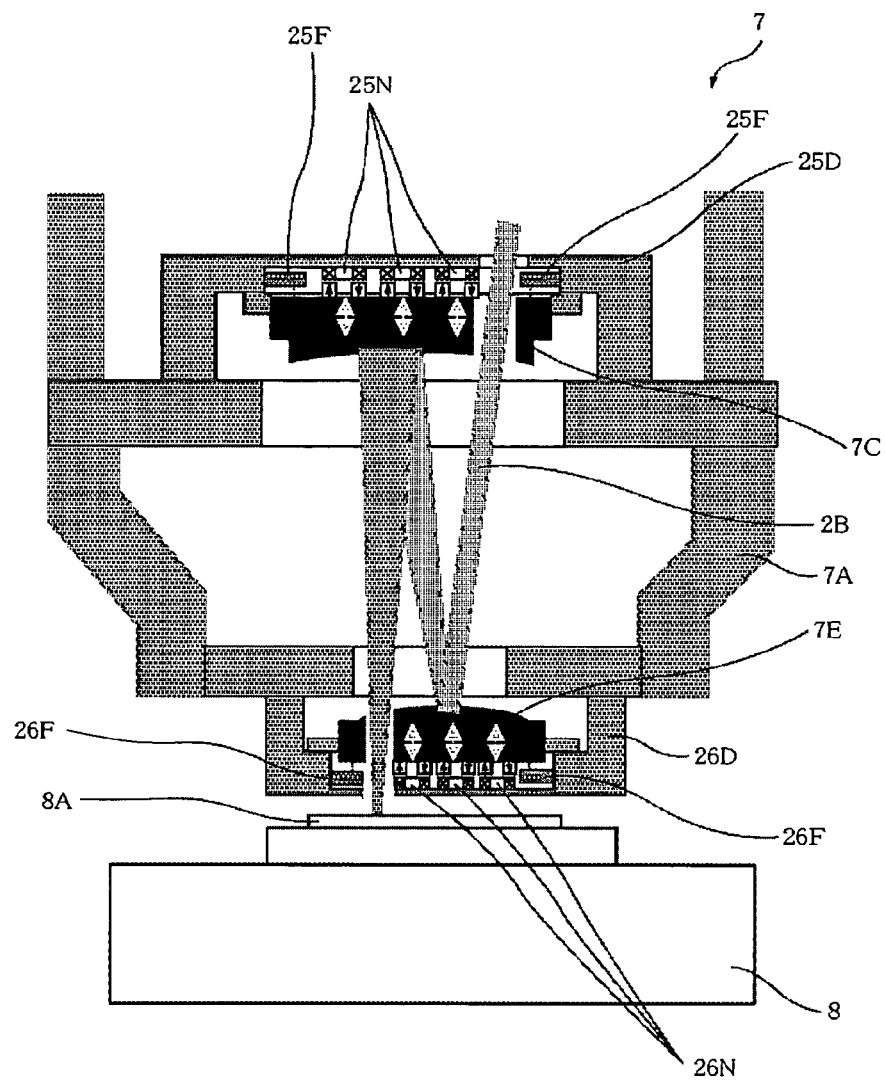
FIG. 7 is a detailed view of mirrors in a projection optical system of another third embodiment.

Thus, the mirror that includes only the gravity compensation means is used for one having a relatively low final correction precision or a relatively low position precision and surface shape precision. However, in precisely adjusting a distribution of the gravity compensation force on the mirror surface, fine adjustments of the mirror's surface shapes and precise gravity compensations (i.e., precise compensations of the deformed mirror surface due to its own weight) are available by properly dispersing plural gravity compensation force generating means 25N on the mirror's rear surface, as shown in FIG. 7.

Figure 8:
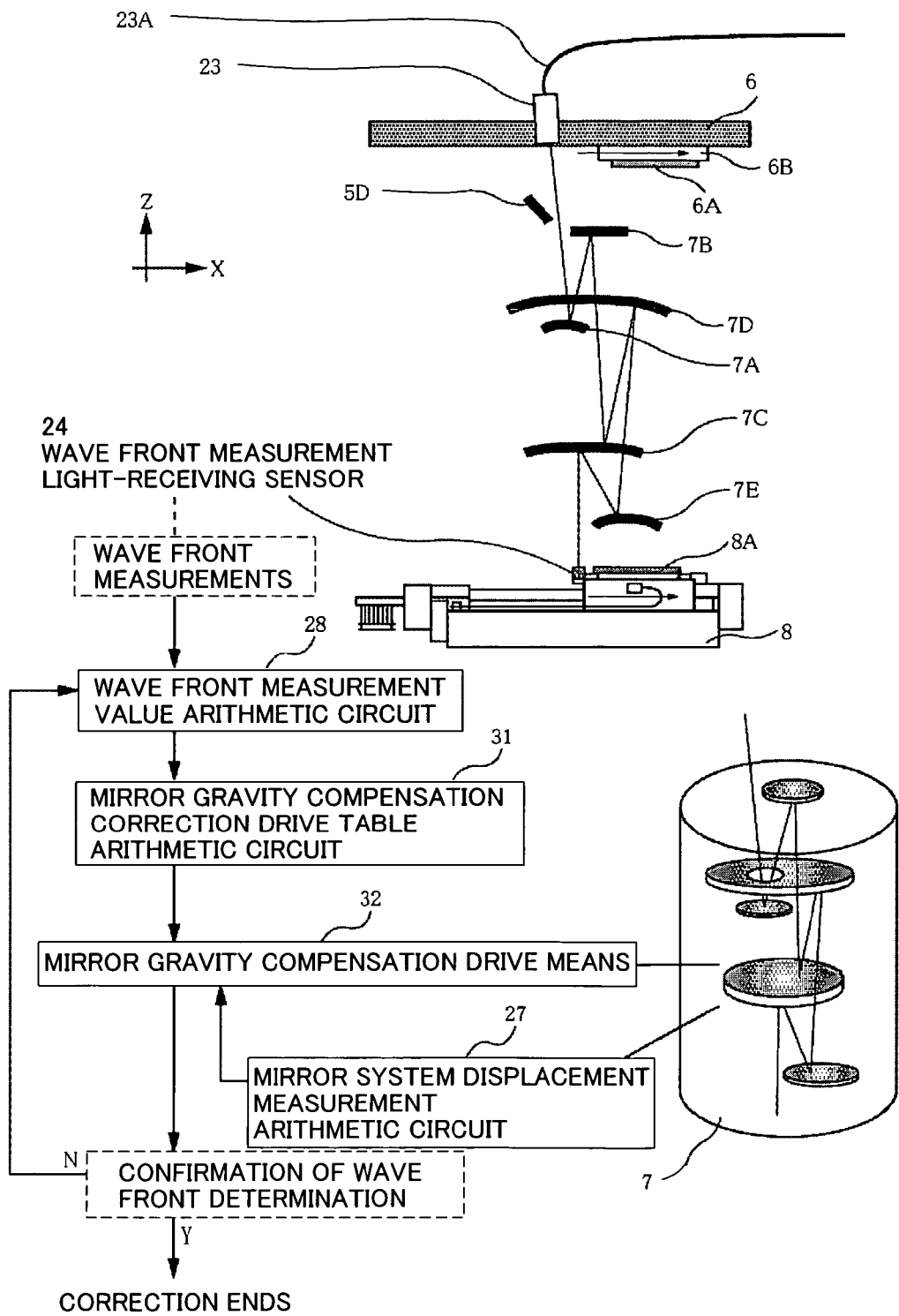
FIG. 8 is a detailed view of mirror wave front measurement means of another third embodiment.

FIG. 8 is a flowchart showing a workflow in the fourth embodiment. While the reticle chuck slider 6B of the reticle stage 6 (i.e., reticle stage slider) retracts, as illustrated, the measurement light supplied from a wave front measurement light source supply optical fiber 23A is emitted from the wave front measurement light source emission opening 23. The measurement light is reflected on the entire reflective surfaces on the mirror in the projection optical system, and the wave front aberration of the projection optical system (for all the mirrors) is measured based on the detection result by the wave front measurement light-receiving sensor 24 installed on the wafer stage 8's movable part receives the light.

Next, a wave front measurement value arithmetic circuit 28 calculates the wave front aberration amount based on the wave front measurement value measured by the wave front measurement light-receiving sensor 24. A mirror gravity compensation correction drive table arithmetic circuit 31 calculates corrective drive directions, drive amounts and applied power amounts of mirrors A (or 7A) to E (or 7E) based on the wave front aberration amount (or wave front measurement operation value), and transmits them as target values to the mirror gravity compensation drive means 32 that includes 25N, 26N, etc.

Simultaneously, the mirror system displacement measurement arithmetic circuit 27 collects signals that reflect position information of the mirrors A (or 7A) to E (7E) from the mirror displacement measurement means 25F and 26F, and measures the mirror positions from the mirror barrel and the relative positions among the mirrors.

After the mirror gravity compensation drive means 30 that includes 25N, 26N, etc. drives each mirror to the target position, the wave front is measured again. When the wave front aberration meets the specification or is below the predetermined amount, the correction ends. However, when the wave front aberration diverts from the specification or is greater than the predetermined amount, the wave front measurement arithmetic circuit recalculates the residual wave front aberration amount to repeat the above correction and reduce the wave front aberration down to the target specification.

The target wave front aberration amount is one generated in the apparatus when the projection optical system solely adjusts a mirror position initially, and reduces the aberration below the appropriate target amount. A position and shape of each mirror at this time are origins of the mirror position and mirror shape. Of course, the target wave front aberration amount may use another value, and the origins for the mirror position and mirror shape may not be those which are obtained at the initial adjustment time. The target value is set only for the wave front aberration amount without introducing a concept of the origins for the mirror position and mirror shape.

With respect to the origin of the mirror position, it is possible to reduce the aberration down to the target position by driving the mirror using the mirror gravity compensation drive means 30 having 25N, 26N, etc.

Fifth Embodiment

Figure 9:
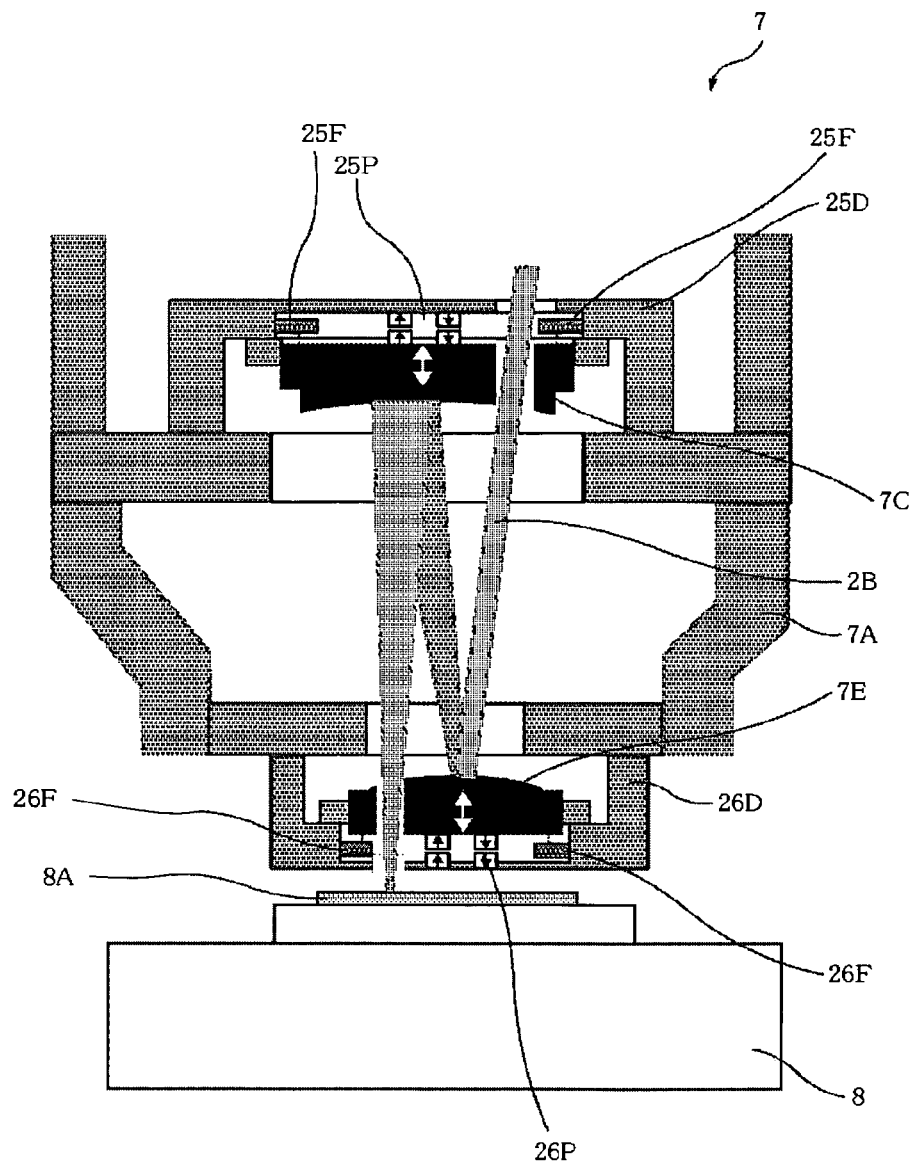
FIG. 9 is a detailed view of mirrors in a projection optical system of another fourth embodiment.
Figure 10:
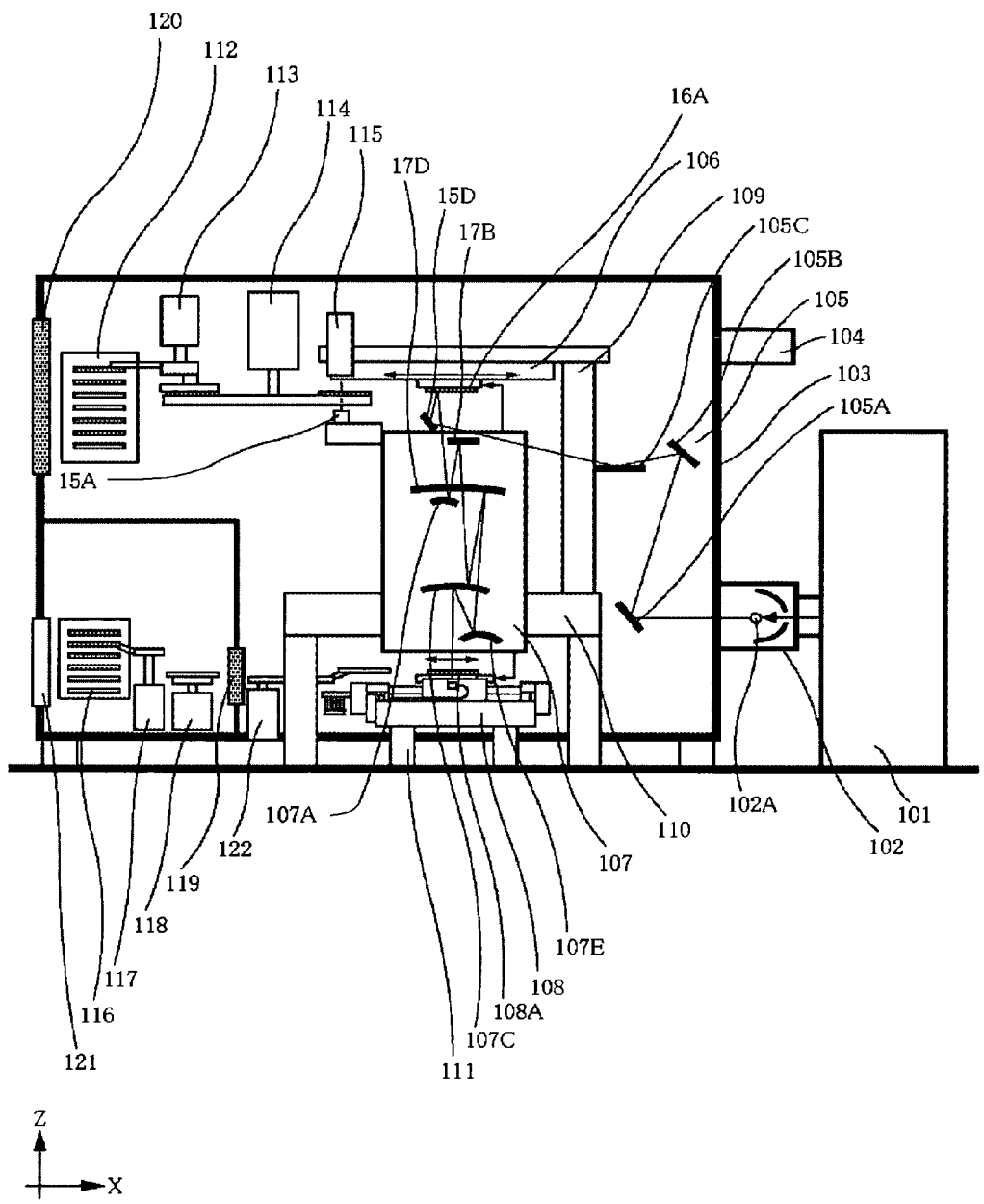
FIG. 10 is an overview of a conventional exposure apparatus.
Figure 11:
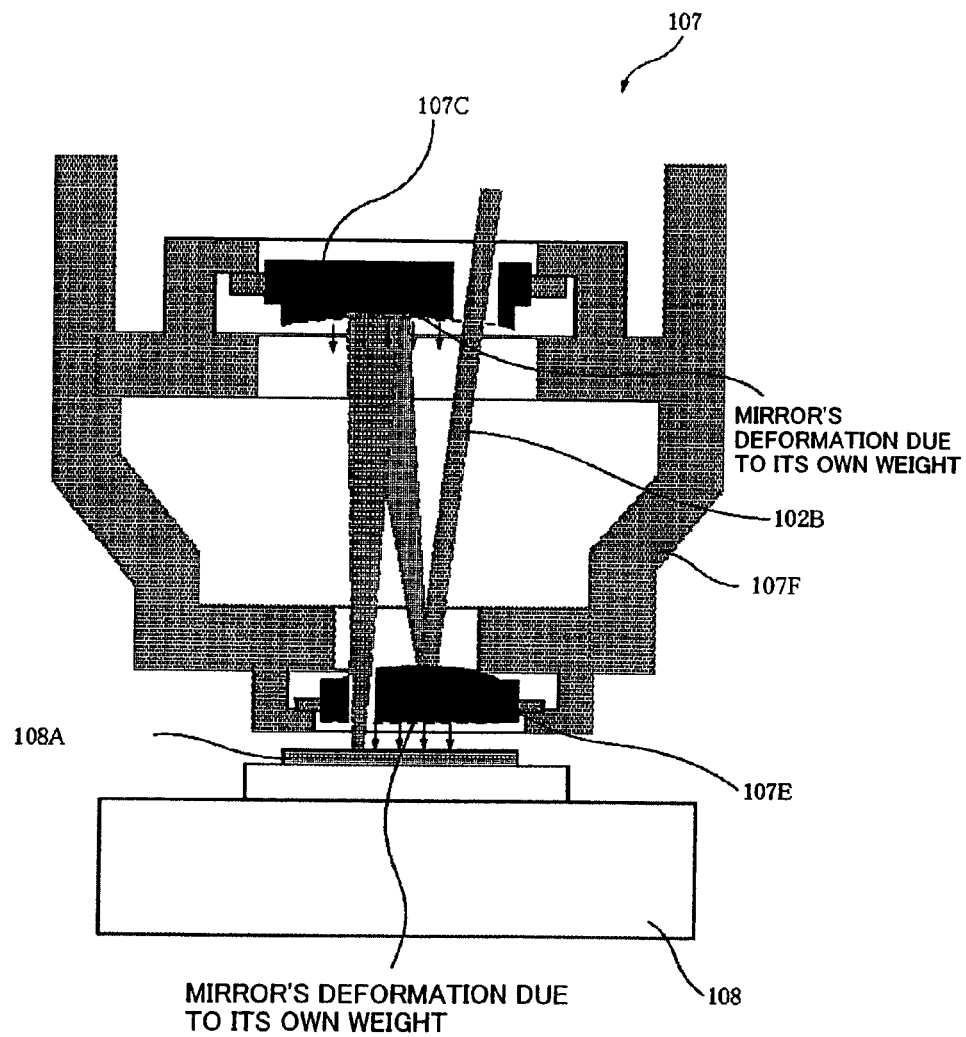
FIG. 11 is a structural view of mirrors in a conventional projection optical system.

A description will be given of the fifth embodiment with reference to FIG. 9. This embodiment has approximately the same structure as that of the fourth embodiment, but is different in using a permanent magnet, electrostatic force or the like for the gravity compensation force generating means 25P and 26P, as in the second and third embodiments. Other than that, this embodiment is approximately similar to the fourth embodiment.

While the first to fifth embodiments have been thus described, the present invention is not limited to these embodiments.

For example, the mirror to be forced or displaced is not limited to the mirrors C and E, but may be any mirrors A to E. The number of mirrors is not limited to six. In addition, the mirror to be forced or displaced is not limited to one in the projection optical system, but can also be one in the illumination optical system.

The instant embodiments address the wave front aberration, and force or displace the mirror based on the wave front aberration. However, the mirror may be forced or displaced based on another reference value, such as other aberration and specific mirror's deformation amount, rather than a detection result of the wave front aberration.

Figure 12:
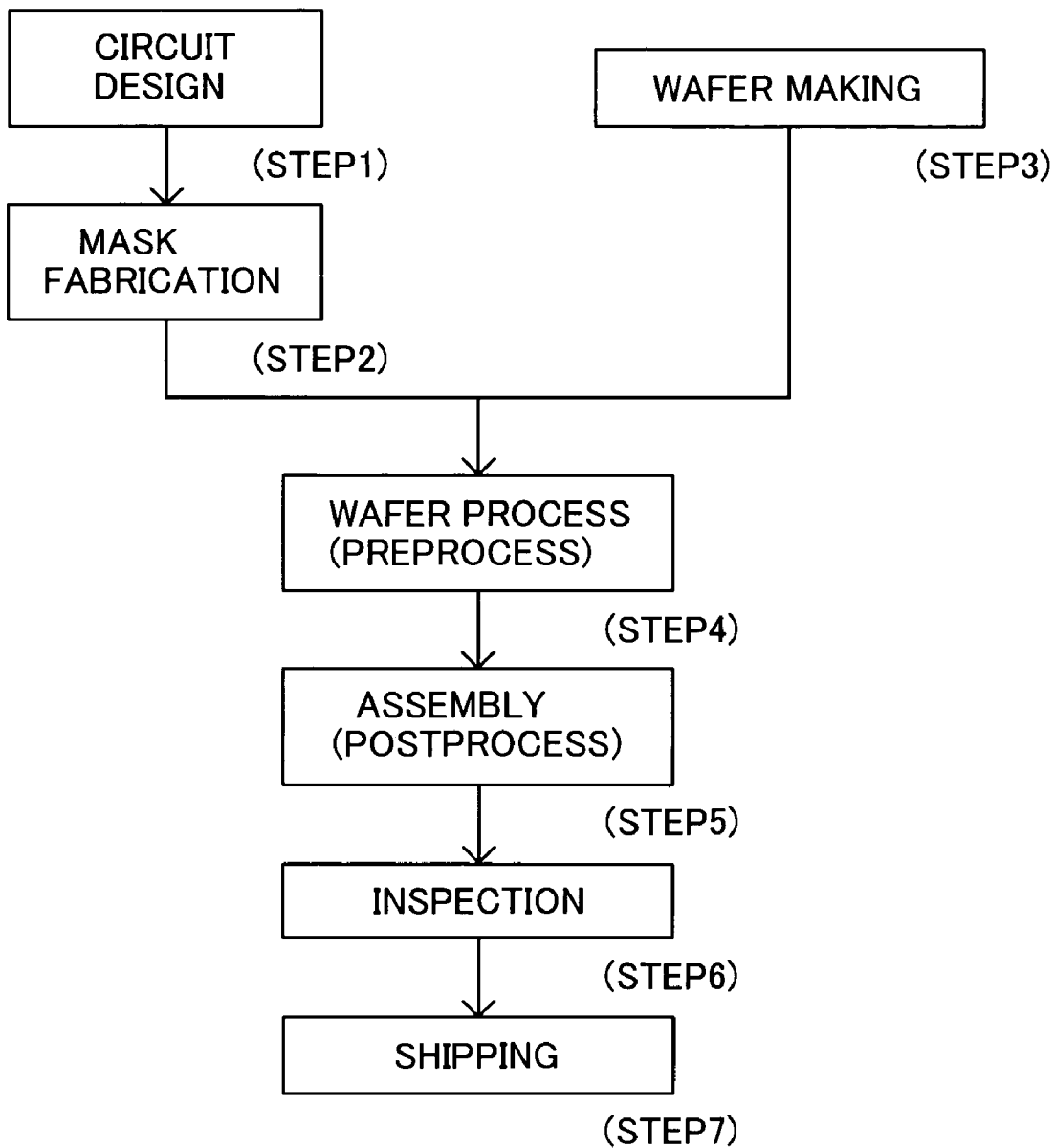
FIG. 12 is a flowchart for explaining a method for fabricating devices (semiconductor chips such as ICs, LSIs, and the like, LCDs, CCDs, etc.).
Figure 13:
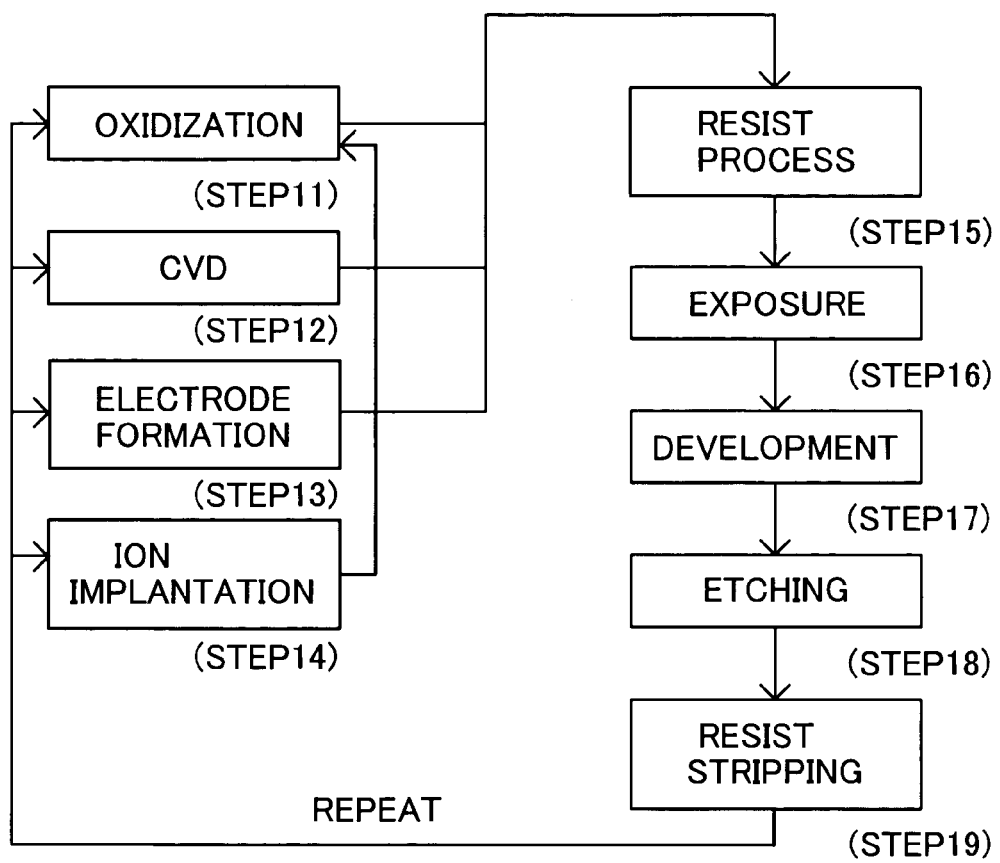
FIG. 13 is a detailed flowchart for Step 4 of wafer process shown in FIG. 12.

Referring to FIGS. 12 and 13, a description will now be given of an embodiment of a device fabricating method using the above exposure apparatus. FIG. 12 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, transforms the wafer formed in Step 4 into a semiconductor chip and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 13 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture higher quality devices than the conventional one. Thus, the device fabrication method using the exposure apparatus, and the devices as finished goods also constitute one aspect of the present invention.

According to the instant embodiment, the exposure apparatus can correct fine displacements and inclinations of the rotational axis in the in-plane translation shift direction and vertical direction, mirror's deformations due to its own weight, and wave front aberration in the projection optical system mirrors, preventing the mirror surface precision, the optical aberration, and deteriorated imaging performance and lowered light intensity in the projection optical system.

What is claimed is:

1. An exposure apparatus that illuminates a pattern on an original form, introduces light from the pattern to a plate, and exposes the plate, said exposure apparatus comprising:
   at least one optical element;
   at least one forcing member that applies a force to the at least one optical element in a non-contact manner;
   a wave front aberration measuring unit for measuring wave front aberration of a projection optical system that includes at least one optical element; and
   a controller for controlling said forcing member based on a measurement result of said wave front aberration measuring unit.

2. An exposure apparatus according to claim 1, wherein said controller calculates a correction amount to the gravity deformation of the at least one optical element and controls said forcing member based on the measurement result.

3. An exposure apparatus according to claim 1, further comprising a plate driving stage for driving the stage, wherein said wave front aberration measuring unit is provided on the plate driving stage.

4. An exposure apparatus that illuminates a pattern on an original form, introduces light from the pattern to a plate, and exposes the plate, said exposure apparatus comprising:
   at least one optical element;
   at least one forcing member that applies a force to the at least one optical element in a non-contact manner;
   a position adjusting unit for adjusting a position of the at least one optical element in a non-contact manner;
   a wave front aberration measuring unit for measuring wave front aberration of a projection optical system that includes at least one optical element; and
   a controller for controlling said position adjusting unit based on a measurement result of said wave front aberration measuring unit.

5. An exposure apparatus according to claim 4, wherein said controller calculates a correction amount to the gravity deformation of the at least one optical element and controls said position adjusting unit based on the measurement result.

6. An exposure apparatus according to claim 4, further comprising a plate driving stage for driving the stage, wherein said wave front aberration measuring unit is provided on the plate driving stage.

* * * * *